United States Patent
Bernstein et al.

(10) Patent No.: US 10,267,886 B2
(45) Date of Patent: Apr. 23, 2019

(54) INTEGRATED IMAGE RECONSTRUCTION AND GRADIENT NON-LINEARITY CORRECTION WITH SPATIAL SUPPORT CONSTRAINTS FOR MAGNETIC RESONANCE IMAGING

(71) Applicant: Mayo Foundation for Medical Education and Research, Rochester, MN (US)

(72) Inventors: Matthew A. Bernstein, Rochester, MN (US); Joshua D. Trzasko, Rochester, MN (US); Shengzhen Tao, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 0 days.

(21) Appl. No.: 15/953,657

(22) Filed: Apr. 16, 2018

(65) Prior Publication Data
US 2018/0238988 A1    Aug. 23, 2018

Related U.S. Application Data

(63) Continuation-in-part of application No. 15/305,443, filed as application No. PCT/US2015/027606 on Apr. 24, 2015.
(Continued)

(51) Int. Cl.
*G01R 33/48* (2006.01)
*G01R 33/58* (2006.01)
(Continued)

(52) U.S. Cl.
CPC ..... *G01R 33/56572* (2013.01); *G01R 33/482* (2013.01); *G01R 33/4824* (2013.01);
(Continued)

(58) Field of Classification Search
CPC ............ G01R 33/56572; G01R 33/482; G01R 33/4824; G01R 33/561; G01R 33/5611; G01R 33/58
See application file for complete search history.

(56) References Cited

U.S. PATENT DOCUMENTS 8,320,646 B2 * 11/2012 Hu ..................... G01R 33/5611
                                                                324/309
2002/0093334 A1 * 7/2002 Zhu .................. G01R 33/56518
                                                                324/307
(Continued)

OTHER PUBLICATIONS

Doran et al. (NPL, A complete distortion correction for MR images: I. Gradient warp correction, Phys. Med. Biol. 50 (2005) 1343-1361) (Year: 2005).*
(Continued)

*Primary Examiner* — Rodney A Bonnette
(74) *Attorney, Agent, or Firm* — Quarles & Brady LLP

(57) ABSTRACT

A system and method for simultaneously reconstructing magnetic resonance images and correcting those imaged for gradient nonlinearity effects are provided. As opposed to conventional methods for gradient nonlinearity correction where distortion is corrected after image reconstruction is performed, the model-based method described here prospectively accounts for the effects of gradient nonlinearity during reconstruction and implements a spatial support constraint to reduce noise amplification effects.

16 Claims, 4 Drawing Sheets

Related U.S. Application Data

(60) Provisional application No. 62/485,452, filed on Apr. 14, 2017, provisional application No. 61/984,300, filed on Apr. 25, 2014.

(51) Int. Cl.
  *G01R 33/561* (2006.01)
  *G01R 33/565* (2006.01)

(52) U.S. Cl.
  CPC ........ *G01R 33/561* (2013.01); *G01R 33/5611* (2013.01); *G01R 33/58* (2013.01)

(56) References Cited

U.S. PATENT DOCUMENTS

| | | | | |
|---|---|---|---|---|
| 2012/0249141 A1* | 10/2012 | Blumhagen | ...... | G01R 33/56563 324/309 |
| 2014/0266198 A1* | 9/2014 | Tadic | ...... | G01R 33/387 324/309 |
| 2014/0312897 A1* | 10/2014 | Tan | ...... | G01R 33/56581 324/307 |

OTHER PUBLICATIONS

Fessler (NPL, Model-Based Image Reconstruction for MRI, IEEE Sig. Proc. Mag., 27(4):81-9, Jul. 2010) (Year: 2010).*

Lee et al. (NPL, The type 3 nonuniformity FFT and its applications, Journal of Computational Physics 206 (2005) pp. 1-5) (Year: 2005).*

* cited by examiner

INTEGRATED IMAGE RECONSTRUCTION AND GRADIENT NON-LINEARITY CORRECTION WITH SPATIAL SUPPORT CONSTRAINTS FOR MAGNETIC RESONANCE IMAGING

CROSS-REFERENCE TO RELATED APPLICATIONS

This application claims the benefit of and herein incorporates by reference in its entirety U.S. Provisional Patent Application Ser. No. 62/485,452, filed on Apr. 14, 2017, and entitled "MODEL-BASED GRADIENT NONLINEARITY CORRECTION FOR MAGNETIC RESONANCE IMAGING WITH SPATIAL SUPPORT CONSTRAINTS"; and is a continuation-in-part of, claims the benefit of, and herein incorporates by reference in its entirety, U.S. patent application Ser. No. 15/305,443, filed on Oct. 20, 2016, which represents the U.S. National Stage of International Application No. PCT/US2015/027606, filed Apr. 24, 2015, which claims the benefit of U.S. Provisional Patent Application Ser. No. 61/984,300, filed Apr. 25, 2014, and entitled "INTEGRATED IMAGE RECONSTRUCTION AND GRADIENT NON-LINEARITY CORRECTION FOR MAGNETIC RESONANCE IMAGING."

STATEMENT REGARDING FEDERALLY SPONSORED RESEARCH

This invention was made with government support under EB010065 awarded by the National Institutes of Health. The government has certain rights in the invention.

BACKGROUND

Due to engineering limitations, the gradient fields used for spatial encoding in clinical magnetic resonance imaging ("MRI") are never truly linear over the imaging field-of-view ("FOV"). As standard MRI signal models presume gradient linearity, reconstructed images exhibit geometric distortion unless gradient deviations are properly accounted for. Given a priori knowledge of the gradient field, geometric distortion due to gradient nonlinearity is typically corrected via image-domain interpolation. Although this retrospective approach, commonly termed gradient distortion correction or "GradWarp," is straightforward, it does not explicitly account for the effects of finite sampling, undersampling, or noise, and may consequently degrade spatial resolution.

Although prospective correction has been considered in situations when gradients are intentionally distorted for encoding purposes, such as parallel imaging techniques using localized gradients ("PATLOC"), this approach has not been considered for the more common scenario where ideally linear gradients are not performing as desired.

As noted, GNL effects are conventionally corrected after image reconstruction using image-domain interpolation, which may be followed by intensity correction using the Jacobian-determinant of the distortion field. The intensity correction is necessary to compensate for GNL-induced image uniformity changes. Although this method has been shown to be effective at correcting coarse image distortions on conventional whole-body MRI systems with moderate GNL, images corrected using this method can suffer from noise amplification at regions with strong GNL distortion (e.g., the peripheral regions of the imaging volume). This problem is especially relevant for large field-of-view imaging on whole-body scanners, and for the compact systems with asymmetric gradient design. The smaller imaging volume (e.g., 26-cm diameter-spherical-volume) of these latter systems, which can be designed for brain and extremity imaging, renders the noise amplification effect to be apparent even in a brain scan FOV of 25.6 cm.

Hence, given the above, there is a need for systems and methods for accurate and efficient correction of gradient nonlinearity in magnetic resonance imaging.

SUMMARY OF THE DISCLOSURE

The present disclosure addresses the aforementioned drawbacks by providing a method for reconstructing an image of a subject while correcting for gradient nonlinearity effects using a magnetic resonance imaging ("MRI") system. The method includes providing to a computer system, magnetic resonance data acquired from a subject using an MRI system. Gradient distortion field data that indicates a spatial distribution of gradient distortions in a field-of-view are also provided to the computer system. Spatial support data that indicates a spatial support by which image reconstruction should be constrained are also provided to the computer system, An image of the subject is then reconstructed from the magnetic resonance data while correcting for errors associated with a gradient nonlinearity by optimizing with the computer system an objective function that incorporates the gradient field distortion data and the spatial support data, thereby simultaneously reconstructing the image of the subject and correcting the image for the errors associated with the gradient nonlinearity The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
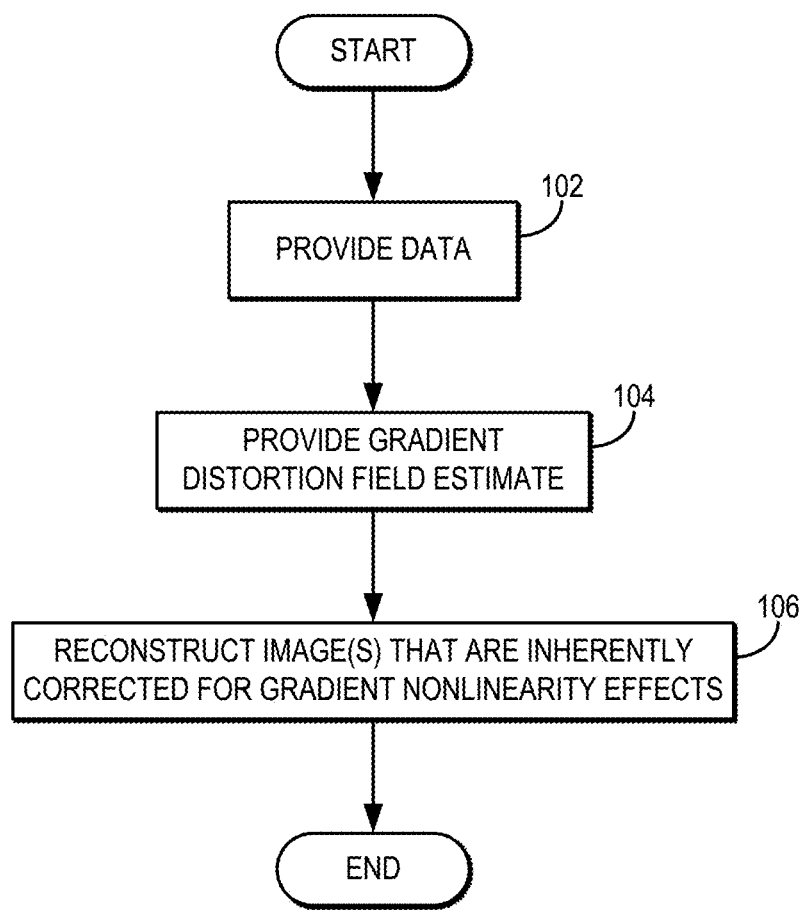
FIG. 1 is a flowchart setting forth steps for an example method for reconstructing magnetic resonance images using an integrated gradient nonlinearity and image reconstruction technique.

Described here are systems and methods for systems and methods for correcting gradient nonlinearities during magnetic resonance image reconstruction. As opposed to conventional methods for gradient nonlinearity correction where distortion is corrected after image reconstruction is performed, the model-based method described here prospectively accounts for the effects of gradient nonlinearity during reconstruction. It is a discovery of the present disclosure that the methods described here can reduce the blurring effect and resolution loss caused by conventional correction algorithms while achieving the same level of geometric correction. Described here are methods that implement a model-based reconstruction with integrated gradient nonlinearity correction and constrained spatial support in order to reconstruct images with reduced gradient nonlinearity-related errors and artifacts. For instance, the methods described in the present disclosure provide for images with reduced noise amplification effects.

Gradient nonlinearity correction is routinely performed in clinical MRI to eliminate geometric spatial distortions that arise from imperfect hardware performance, and any improvements to this process may offer widespread benefit. For instance, the ability of prospective gradient nonlinearity correction to preserve spatial resolution may be particularly beneficial for longitudinal MRI studies looking for subtle image changes, and in the design of novel scanner architectures based on fast but sensitive gradients systems.

Standard gradient nonlinearity correction processes require specific information about the gradient distortion fields. This information is typically proprietary and not available for general public use. Moreover, vendor-provided distortion information is generally specific only to the type of MRI scanner, not individual machines, and so does not account for scanner-specific distortions due to hardware variations.

The system and method provided by the present disclosure include a technique that prospectively accounts for distortions due to gradient nonlinearity during, rather than after, image reconstruction. This approach lessens the tradeoff between geometric accuracy and spatial resolution inherent to retrospective correction strategies. In addition, the approach of the present disclosure readily integrates into existing MRI reconstruction strategies and may facilitate its adoption. Additional improvements may include reducing the computational cost of the added NUFFT operations.

In some embodiments, information about a gradient distortion field is provided from storage on a magnetic resonance imaging ("MRI") system, as described above. In some other embodiments the gradient distortion field can be estimated from phantom images or by using electromagnetic simulations.

In the presence of gradient nonlinearity, a measured MRI signal generated using an MRI system can be modeled as follows, $$g[k] = \int_\Omega f(x) e^{-j\omega[k]\Delta(x)} dx + n[k] \quad (1)$$

where f is the continuous target signal, x is the spatial position vector, $\Delta(x)$ is the spatial distortion function due to gradient nonlinearity, $\Omega$ is the field of excitation, g[k] is the $k^{th}$ signal measurement at k-space position $\omega[k]$, and n is complex Gaussian noise. In some embodiments, the spatial distortion function due to gradient nonlinearity is assumed to be a priori known; however, as will be described below, in some embodiments this function can be estimated from quality assurance, or other, phantoms.

The problem of reconstructing the continuous image function, f (x), from a finite measurement vector, g, is intrinsically ill-posed without auxiliary assumptions about the target signal. Typically, a finite series representation of f (x) is assumed. That is, $$f(x) \approx \sum_{i \in \Theta} u[i] b(x - r[i]); \quad (2)$$

where b (x) is a continuous pixel basis function, r[i] is a pixel position vector, and u(i) is the corresponding display coefficient of the $i^{th}$ pixel. Assuming a Dirac delta pixel model where b (x)=$\delta$(x), the forward signal model in Eqn. (1) gives, $$g(k) \approx \sum_{i \in \Theta} u[i] e^{-j\omega[k]\Delta(r[i])} + n[k]; \quad (3)$$

which can be expressed in the following affine algebraic form:

$$g = Au + n \quad (4);$$

where $A(k,i) = e^{-j\omega[k]\Delta(r[i])}$ denotes the forward spatial encoding operator. For non-accelerated Cartesian imaging, the set of k-space samples lie on a discrete uniform grid. Although image pixels are also generally assumed to lie on a similar uniform grid, r[i], the presence of the distortion field (i.e., when $\Delta(r[i]) \neq r[i]$ in Eqn. (4)) causes the image pixels to be displaced in the discrete forward model according $\Delta(r[i])$. Therefore, the nominal spatial grid of an image reconstructed under Eqn. (4) may actually be nonuniform.

Thus, in the presence of gradient nonlinearity, A is mapping from a non-uniform image space grid onto a uniform k-space grid for Cartesian MRI. In this instance, the forward operator can be efficiently implemented using a type-I non-uniform fast Fourier transform ("NUFFT") operator, which can be defined as follows:

$$A - DFT \quad (5);$$

where $\Gamma$ is a matrix representing a convolution interpolation operation that maps the irregular image grid onto an oversampled uniform image grid; F is an oversampled Fourier transform operator, such as an oversampled discrete Fourier transform (which may be implemented via fast Fourier transform); and D is a pixelwise deapodization function that compensates for blurring induced by the convolutional kernel, $\Gamma$. For non-Cartesian sampling, the forward operator can be efficiently implemented using a type-III NUFFT operator.

In some embodiments, MRI data are acquired using multiple coils and receiver channels. With this configuration, the data can be undersampled (i.e., only a subset of the data normally obtained during a scan is collected) to reduce overall scan time. Letting K, C, and N denote the total numbers of k-space samples, receiver coils, and pixels in the reconstructed image, respectively, the signal model in Eqn. (4) can be generalized to the following:

$$G = \Phi A U + N \quad (6);$$

where G is a K×C measurement matrix, $\Phi$ is a K×N binary row selection matrix that indicates the subset of Fourier elements actually sampled during an exam, U is an N×C targeted underlying multi-channel image set, and N is proper a K×C proper complex Gaussian noise matrix.

As one example, both fully sampled and undersampled MRI data can be reconstructed using a penalized regression algorithm, which seeks to produce the image most likely to have produced the set of noisy measurements while potentially also satisfying some other expected properties, such as sparsity. Because noise in MRI is Gaussian distributed, a penalized least squares regression of the following general form can often be used:

$$\{\hat{U}\} = \arg\min_{U \in C^{N \times C}} \{\lambda P(U) + \|\Phi A U - G\|_F^2\};\tag{7}$$

where $\|\cdot\|_F^2$ is the Frobenius norm of a matrix; $P(\cdot)$ is a regularization, or penalty, functional that promotes some desired property in the reconstructed image; and $\lambda \geq 0$ is a mixing parameter that controls the relative preference placed onto the penalty functional and the data fidelity term.

It is noted that Jacobian-based intensity correction is not an explicit part of this model, as its effect is implicitly accounted for in the forward signal model. Also, it is noted that Eqn. (7) prospectively accounts for the presence of data noise. For the special case of $\lambda=0$, Eqn. (7) provides the maximum likelihood estimate of U. Moreover, Tikhonov and locally low rank ("LLR") penalties can be included via specific definition of the penalty functional to provide robustness and stability when reconstructing undersampled datasets collected during accelerated scans.

Having described the general framework for integrating gradient nonlinearity correction into the image reconstruction process by utilizing an appropriately designed signal model, several examples of incorporating this model-based correction into different reconstruction techniques are now provided.

Example #1

Reconstruction for Fully Sampled Cartesian Acquisition

As one example, when Cartesian sampling is used with no undersampling ($\Phi=I$) or regularization ($\lambda=0$), Eqn. (7) reduces to an ordinary least squares regression and has a simple closed form solution given by the following:

$$\{\hat{U}\} = \arg\min_{U} \{\|AU - G\|_F^2\} = (A^*A)^{-1} A^* G;\tag{8}$$

which can be iteratively solved via standard or conjugate gradient descent. The inverse Gramian matrix, $(A^*A)^{-1}$ can be well approximated by a diagonal matrix constructed from the Jacobian determinant of the distortion field, J, which in turn provides a noniterative pathway for performing coil-by-coil gradient nonlinearity corrected reconstruction of fully sampled Cartesian MRI data, as follows:

$$\{\hat{U}\} = \{\hat{U}_{approx}\} = JA^*G\tag{9}.$$

The approximate solver in Eqn. (9) is a noniterative method based on the signal model described above, and thus utilizes explicit oversampled interpolation and deapodization steps, which enables the later performance of coarse geometric distortion correction without introducing significant image blurring.

Example #2

Partial Fourier Homodyne Acquisition

As another example, gradient nonlinearity can be corrected for during reconstruction of data acquired using a partial Fourier homodyne acquisition. Partial Fourier accelerations are based on the assumption that the target signal is strictly real-valued, and that any spurious image phase is either a priori known or can be easily estimated from a low-frequency reference signal. Because the Fourier transform of a real-valued signal is conjugate symmetric, partial Fourier methods enable upwards of two-fold acceleration.

Assuming that the target signal is real-valued, the signal model in Eqn. (4) can be re-expressed as:

$$g = A\psi u_r + n\tag{10};$$

where the notation $u_r$ denotes that the target signal is real-valued. The diagonal matrix, $\psi$ (where $\psi_{i,i} = e^{j\Theta_i}$) represents the apparent image phase that may be due to receive $B_1$ field inhomogeneity, off-resonance, eddy current effects, or combinations thereof. As described below, this apparent image phase can be estimated from a fully-sampled, low-frequency region of k-space.

Standard partial Fourier methods construct method-of-moments estimates of $u_r$ from the measurements, g. Noting that the expected value of Eqn. (10) is $A\psi u_r$, the real-valued signal, $u_r$, can be estimated as, $$u_r = \text{real}\{\psi^*(A^*A)^{-1}A^*g\}\tag{11};$$

where the ensemble average (i.e., the expected value) has been replaced with the sample average or observation vector. As described above, the operator $(A^*A)^{-1}$ can be approximated by a real-valued diagonal matrix, $\text{diag}\{J\}$, where J is the Jacobian determinant of the gradient nonlinearity-induced distortion field. Thus, Eqn. (11) can be rewritten as, $$u_r \approx \text{real}\{\psi^* \text{diag}\{J\} A^*g\}\tag{12}.$$

Denoting $\Phi_L$ as the binary operator extracting the central, low-pass region of k-space, and denoting $\Phi_{H_1}$ and $\Phi_{H_2}$ as symmetrically extracting the high-pass regions above and below the center of k-space, respectively, then, the signal measurement vector can be split up along the phase encoding or readout direction as follows:

$$u_r \approx \text{real}\{\psi^* \text{diag}\{J\} A^* (\Phi_L + \Phi_{H_1} + \Phi_{H_2}) g\}\tag{13}$$

$$= \text{real}\{\psi^* \text{diag}\{J\} A^* (\Phi_L + 2\Phi_{H_1}) g\} +$$

$$\text{real}\{\psi^* \text{diag}\{J\} A^* (\Phi_{H_2} - \Phi_{H_1}) g\}.$$

Homodyne reconstruction recovers the real-valued image vector by assuming conjugate symmetry of k-space measurements, leading to, $$\text{real}\{\psi^* \text{diag}\{J\} A^* (\Phi_{H_2} - \Phi_{H_1}) g\} \approx 0\tag{14};$$

hence, $u_r$ can be reconstructed by:

$$u_r \approx \text{real}\{\psi^* \text{diag}\{J\} A^* (\Phi_L + 2\Phi_{H_1}) g\}\tag{15}.$$

Similar to its original counterpart, the homodyne reconstruction as in Eqn (15) is non-iterative.

In standard partial Fourier methods, the image phase estimate, $\psi$, is constructed from a fully-sampled low-frequency region of k-space. However, Eqn. (10) presumes that the phase map is inherently gradient nonlinearity distortion-free. As a result, the reference signal is preferably derived from a low-resolution image generated using the integrated gradient nonlinearity correction, such as by, $$\psi_{i,i} = e^{j\angle(\text{diag}\{J\} A^* \Phi_L g)_i}\tag{16};$$

where the $\angle(\cdot)$ operator returns the phase map of a complex vector.

Example #3

GRAPPA

In general, the integrated gradient nonlinearity and image reconstruction technique can be adapted for accelerated acquisitions, such as those implemented for parallel imaging techniques. In general, parallel imaging techniques exploit redundancies between data acquired using phased array receivers to reduce the amount of data required to generate an MR image.

As one example, the integrated gradient nonlinearity and image reconstruction technique can be adapted for GRAPPA-based acquisitions and reconstructions. GRAPPA is an auto-calibrating k-space based parallel imaging method that reconstructs a full set of coil images from undersampled k-space data.

Denoting G as the M×C multi-channel k-space data matrix, where M and C are the number of k-space measurements per coil and the number of coils, respectively, the forward signal model of GRAPPA is, $$G = AU + N \quad (17);$$

where U is the N×C matrix (where N denotes the total number of image pixels) representing the set of coil images and the matrix N is the N×C proper Gaussian noise matrix. For an accelerated acquisition, N≥M. Note that Eqn. (17) is a generalization of Eqn. (4), similar to Eqn. (6). Following auto-calibration, GRAPPA estimates missing k-space values using Fourier-domain interpolation. The N×C fully-sampled multi-coil k-space data matrix that is estimated by GRAPPA, $\hat{G}$, can be denoted as, $$\hat{G} = H_{GRAPPA}\{G\} \quad (18);$$

where $H_{GRAPPA}\{\cdot\}$ is the k-space interpolation operator that is derived from auto-calibration signal ("ACS") data prior to image reconstruction.

Because GRAPPA reconstruction occurs entirely in k-space, integrated gradient nonlinearity correction does not need to be embedded within this process and can simply be performed while transforming the reconstruction result from k-space to the image domain in a way similar to the case of full k-space sampling, $$U = (A^*A)^{-1}A^*\hat{G} \approx \text{diag }\{J\}A^*\hat{G} \quad (19).$$

Again, the Jacobian determinant approximation is used. Similarly, if the target signal is presumed to be real-valued, homodyne techniques can also be incorporated into this reconstruction process to yield, $$u_c \approx \text{real}\{\psi_c^* \text{diag}\{J\}A^*(\Phi_L + 2\Phi_{H_1})g_c\} \quad (20);$$

where $u_c$, $g_c$, and $\psi_c$ denote the real-valued image, the GRAPPA reconstructed k-space signal, and the phase map of the $c^{th}$ coil, respectively.

As will be appreciated by those skilled in the art, while the above approach has been outlined for GRAPPA, including partial Fourier reconstruction, this approach can also be readily implemented for k-space or hybrid k-space/image auto-calibrating multi-channel reconstruction strategies other than GRAPPA.

Example #4

SENSE

As another example, the integrated gradient nonlinearity and image reconstruction technique can be adapted for SENSE-based acquisitions and reconstructions. SENSE is another widely-used parallel imaging method for accelerated acquisitions. Whereas GRAPPA reconstructs coil images individually, SENSE reconstructs a single image from the measured multi-channel data set. Assuming uniform, Cartesian under-sampling, the k-space MR signal observed during a standard SENSE acquisition can be modeled as, $$g = (I \otimes \Phi A)Su + n \quad (21);$$

where g is an MC×1 multi-coil k-space data vector, S is an NC×N block diagonal matrix that represents the true (i.e., distortion-free) sensitivity profiles of receive coils, Φ is an M×N matrix representing a uniform under-sampling operator, u is the N×1 target image vector, and n is an MC×1 noise vector. Additionally, I denotes a C×C identity matrix and the "⊗" operator is the Kronecker product.

SENSE reconstruction estimates the target image vector, u, by solving the following regularized least-squared estimation problem:

$$\underset{u}{\text{argmin}}\{\|g - (I \otimes \Phi A)Su\|_2^2 + \lambda\|u\|_2^2\}; \quad (22)$$

where the regularization parameter, λ>0, stabilizes the matrix inversion process implicit to this problem. This problem can be solved iteratively (e.g., via conjugate gradient iteration); however, the computational efficiency of this approach may not be sufficient for routine clinical use, particularly considering that standard SENSE reconstruction (without integrated GNL correction) is non-iterative. Although CG iteration is widely used for solving quadratic estimation problems like Eqn. (22), there exist many viable alternative numerical strategies. One such alternative optimization strategy is alternating direction method-of-multipliers ("ADMM"), which breaks apart a compound optimization problem like Eqn. (22) into a series of relatively easier tasks.

In standard reconstruction and gradient nonlinearity correction techniques, a conventional SENSE reconstruction is first performed on the undersampled data after which image domain gradient nonlinearity correction is applied to the resultant image. To utilize the proposed integrated gradient nonlinearity correction in a direct manner, the uncorrected SENSE image result can instead be Fourier transformed back to k-space, and the standard integrated gradient nonlinearity correction process for fully-sampled data can be applied. This process actually corresponds to the first iteration of a particular ADMM routine for solving Eqn. (22), assuming a zero-valued initialization). Specifically, the initial standard SENSE reconstruction without gradient nonlinearity correction is performed as, $$v = [\hat{S}^*(I \otimes F^*\Phi^*\Phi F)\hat{S} + \mu I]^{-1}\hat{S}^*(I \otimes F^*\Phi^*)g \quad (23);$$

where $\hat{S}$ represents the set of gradient nonlinearity-distorted (i.e., non-corrected) coil sensitivity profiles and F is the discrete Fourier transform ("DFT") operator. The parameter μ>0 is an independent ADMM optimization parameter which, in the context of Eqn. (22), stabilizes the SENSE inversion process in manner similar to the parameter λ. The subsequent transform and gradient nonlinearity correction process is then, $$u = \alpha(\lambda)\text{diag}\{J\}A^*Fv \quad (24);$$

where α is an optional normalization constant that is a function of λ. Executing just a single iteration of the ADMM scheme for Eqn. (22) leads to improvements in spatial resolution relative to the standard SENSE reconstruction and gradient nonlinearity correction pipeline. For many practical applications, it is contemplated that this simple non-iterative routine will provide sufficient benefits. If further gains in performance are desired, additional iterations of the ADMM procedure can be executed, or an iterative conjugate gradient algorithm can be executed.

Like GRAPPA, the homodyne strategy can also be integrated into SENSE reconstruction algorithm to enable additional acceleration. This process mirrors Eqn. (15), using the gradient nonlinearity-corrected SENSE reconstruction process in Eqn. (24) (which is denoted below in Eqn. (25) as $H_{SENSE}\{\cdot\}$) in lieu of the integrated gradient nonlinearity correction process for the fully-sampled data, $$u_r = \text{real}\{\psi^* H_{SENSE}\{(\Phi_L + 2\Phi_{H_1})g\}\} \quad (25);$$

where the reference phase is here estimated as, $$\psi_{i,j} = e^{j\angle(H_{SENSE}\{\Phi_L g\})i} \quad (26).$$

Eqn. (25) reduces to standard SENSE with homodyne acquisition when $\Delta(x)=0$ (i.e., without integrated gradient nonlinearity correction).

Referring now to FIG. 1, a flowchart is illustrated as setting forth the steps of an example of a method for reconstructing an image from magnetic resonance data using an integrated image reconstruction and gradient nonlinearity correction technique, such as those described above in detail. The method begins by providing data for reconstruction, as indicated at step 102. In some aspects, the data may be provided by acquiring the data using an MRI system using any suitable acquisition method. In some other aspects, the MRI data can be previously acquired data that is provided by retrieval from data storage. As described above, the methods described in the present disclosure can be readily adapted for both Cartesian and non-Cartesian acquisitions (including echo planar imaging ("EPI")), whether or not undersampling is also implemented.

As part of the integrated reconstruction and gradient nonlinearity correction process, an estimate of the gradient distortion field for the MRI system is provided, as indicated at step 104. The gradient distortion field estimate can be provided by retrieving the appropriate information from the MRI system data storage, by performing an appropriate electromagnetic simulation, or by using a calibration procedure based on phantom images acquired with the MRI system.

As described above, in some embodiments the gradient distortion field can be provided from storage on an MRI scanner, or otherwise simulated using electromagnetic simulations. In other embodiments, however, the integrated image reconstruction and gradient nonlinearity correction can include an independent calibration process for estimating gradient distortions in individual scanners. As one example, MRI quality assurance phantoms with a priori known geometries are used to estimate the distortion field. Residual distortions present in images corrected using the estimated distortion field information are then iteratively minimized. This process requires no vendor-specific or proprietary information, and can thus be broadly implemented. In addition, because a gradient distortion field estimated from an imaged phantom is scanner-specific, not just model-specific, such estimations will generally be more accurate than universal models.

In one example, described below in more detail, this calibration procedure can be implemented using a quality assurance phantom, such as an Alzheimer's Disease Neuroimaging Initiative ("ADNI") phantom, and corresponding analysis software, such as AQUAL software; however, the described methodology can be readily adapted for other analogous phantoms and their associated, or otherwise appropriate, analysis software.

As indicated generally at 106, images are next reconstructed while also correcting for gradient nonlinearity effects. For instance, images are reconstructed using a model-based estimation process that provides correction for gradient nonlinearities during, rather than after, image reconstruction. In general, this process is based on a signal model that incorporates the gradient distortion field to account for the gradient nonlinearity effects, such as the signal models referenced in Eqns. (4), (6), (10), (17), or (21).

Gradient Distortion Estimation from Phantom Images

Example methods for estimating the gradient distortion field from images of phantoms are now described. In general, suppose a magnetic resonance image, x, was acquired using spatial encoding gradients whose performance is not exactly linear, as is expected by conventional MRI theory. If the N×3 coefficient set, C, for the spherical harmonic expansion of the gradient field is known, then this image could be geometrically corrected using standard gradient nonlinear correction techniques; that is, a corrected image, $X_{corrected}$, can be produced as, $$x_{corrected} = F\{x, C\} \quad (27).$$

MRI scanner vendors commonly perform corrections of this type for all images that they display; however, the coefficient matrix, C, is generally treated as proprietary information and may not be available to the public for general use. Typically, MRI vendors estimate the coefficient matrix, C, for a specific magnet model via electromagnetic ("EM") simulation, and use this matrix for all scanner models of a given type. In practice, however, differences in magnetic coil winding, scanner siting, and other factors can cause the true or ideal coefficients, C, to vary across scanners of the same type. Based on the factors mentioned above, there is motivation to develop a gradient distortion estimation strategy that can independently calibrate any individual MRI scanner without needing the proprietary coefficient matrix information.

Now, suppose x represents an image of a phantom object with a priori known geometry, such as the ADNI phantom, and that there exists an operator, $A\{\cdot\}$, that identifies the spatial position of M markers within the image, X; namely, $$P = A\{x\} \quad (28);$$

where P is an M×3 matrix. Additionally, let $P_0$ be an M×3 matrix representing the expected true position of the markers. The spatial distortion of an image due to gradient nonlinearity can then be summarized by the mean square error ("MSE") of measured versus actual marker positions; that is, $$MSE(x) = \|A\{x\} - P_0\|_F^2 \quad (29).$$

Similarly, the spatial distortion MSE of a corrected image is, $$MSE(x, C) = \|A\{F\{x, C\}\} - P_0\|_F^2 \quad (30).$$

Presuming that the distorted image, x, is fixed, the gradient distortion field can be estimated by finding the spherical harmonic basis coefficients, C, that minimize the above MSE quantity; namely, $$[\hat{C}] = \underset{C}{\operatorname{argmin}}\{\|A\{F\{x, C\}\} - P_0\|_F^2\}. \quad (31)$$

This estimation process can be carried out using any number of suitable numerical optimization routines, two examples of which are now described.

Presuming that the image, x, is known, the following affine function can be defined:

$$H\{\cdot\} = A\{F\{x,\cdot\}\} - P_0 \quad (32);$$

Additionally, suppose that a guess about the coefficient matrix, $C_{prior}$, is known or can otherwise be reasonably selected. Setting $C = C_{prior} + \Delta C$, Eqn. (31) can be equivalently expressed as, $$[\Delta \hat{C}] = \underset{\Delta C}{\operatorname{argmin}}\{\|H\{C_{prior} + \Delta C\}\|_F^2\}. \quad (31)$$

Because $H\{\cdot\}$ is nonlinear and possibly not defined by a closed-form mathematical expression, a Gauss-Newton optimization strategy can be used for solving Eqn. (33). This approach includes a linear approximation of $H\{\cdot\}$, which can be achieved using a first-order Taylor expansion; namely, $$H\{C_{prior} + \Delta C\} \approx H\{C_{prior}\} + J_H\{C_{prior}\} \odot \Delta C \quad (34);$$

where $J_H\{\cdot\}$ denotes the rank-4 Jacobian tensor for $H\{\cdot\}$ and the "$\odot$" is the multilinear inner product operator. Specifically, $$[J_H\{X\}]_{(m,n),(p,q)} = \left.\frac{\partial [H\{X'\}]_{(m,n)}}{\partial [X']_{(p,q)}}\right|_{X'=X}; \quad (35)$$

and $$[J_H\{X\} \odot Y]_{(m,n)} = \sum_{p,q} [J_H\{X\}]_{(m,n),(p,q)} [Y]_{(p,q)}. \quad (36)$$

Based on these definitions, the Gauss-Newton algorithm for solving Eqn. (33) can be generalized by the following steps:

---
Algorithm 1: Gauss-Newton Iteration for Gradient Distortion Estimation

INPUT: x, $C_0$, maxIter
for t = 1:maxIter
    $\Delta C_{t+1} = \underset{\Delta C}{\operatorname{argmin}} \|H\{C_t\} + J_H\{C_t\} \odot \Delta C\|_F^2$
    $C_{t+1} = C_t + \Delta C_{t+1}$
end

---

Even though the preceding algorithm represents a logical strategy for performing gradient distortion estimation, determining and evaluating the rank-4 Jacobian of the spatial distortion function, $H\{\cdot\}$, can be generally impractical or infeasible. Consequently, an approximate Gauss-Newton algorithm that replaces the Jacobian operator with a suitable, lower-dimensional approximation can be implemented. The functional behavior of the spatial distortion function is roughly, $$H\{0\} - H\{C\} \approx S_0 C \quad (37);$$

where the M×P matrix, $S_0$, is the spherical harmonic basis evaluated at the true marker spatial positions, $P_0$. That is, Eqn. (37) means that the difference between marker positions in an uncorrected image and corrected image is determined only by the distortion field. In practice, other factors such as the specific correction strategy used, and variations in the analysis software, will also impact this quantity. But, these factors can be ignored while still achieving a reasonable approximation. It should be appreciated by those skilled in the art that other approximations similar to Eqn. (37) may also be viable. From Eqn. (34), it then follows that, $$J_H\{C\} \odot \Delta C \approx -S_0 \Delta C \quad (38).$$

Consequently, the first step of Algorithm 1 resorts to, $$C_{t+1} = \underset{\Delta C}{\operatorname{argmin}} \|H\{C_t\} - S_0 \Delta C\|_F^2 = S_0^\dagger H\{C_t\}; \quad (39)$$

where the superscript "$\dagger$" denotes the (left) pseudo-inverse. Following from Eqn. (39), Algorithm 1 subsequently transforms to:

---
Algorithm 2: Approximate Gauss-Newton Iteration for Gradient Distortion Estimation INPUT: x, $C_0$, maxIter
for t = 1:maxIter
    $C_{t+1} = C_t + S_0^\dagger H\{C_t\}$
End

---

This fast approximation algorithm is very straightforward to implement and execute. Moreover, given the generally small column size of $S_0$, matrix pseudo-inverses can also be calculated using direct methods.

An example of estimating a gradient distortion field based on images of a quality assurance phantom is now described. The ADNI quality assurance phantom is a popular tool for estimating residual geometric distortion in post-correction MR images. Software, such as AQUAL, is also available for estimating the nominal versus actual position of phantom fiducial markers. The ADNI phantom can be imaged and an image volume initially reconstructed without any on-scanner gradient nonlinearity correction, yielding geometrically distorted results (see first column of FIG. 2).

Given an initial distorted image, x, of the ADNI phantom and fiducial marker positions, $P_0$ (e.g., from the AQUAL software), the calibration procedure described above was run for 25 iterations. The algorithm was initialized at C=0, such that no vendor proprietary information was used at any stage of the estimation process. For all intermediary estimates of C, gradient nonlinearity correction was performed via image-domain cubic spline interpolation.

Figure 2:
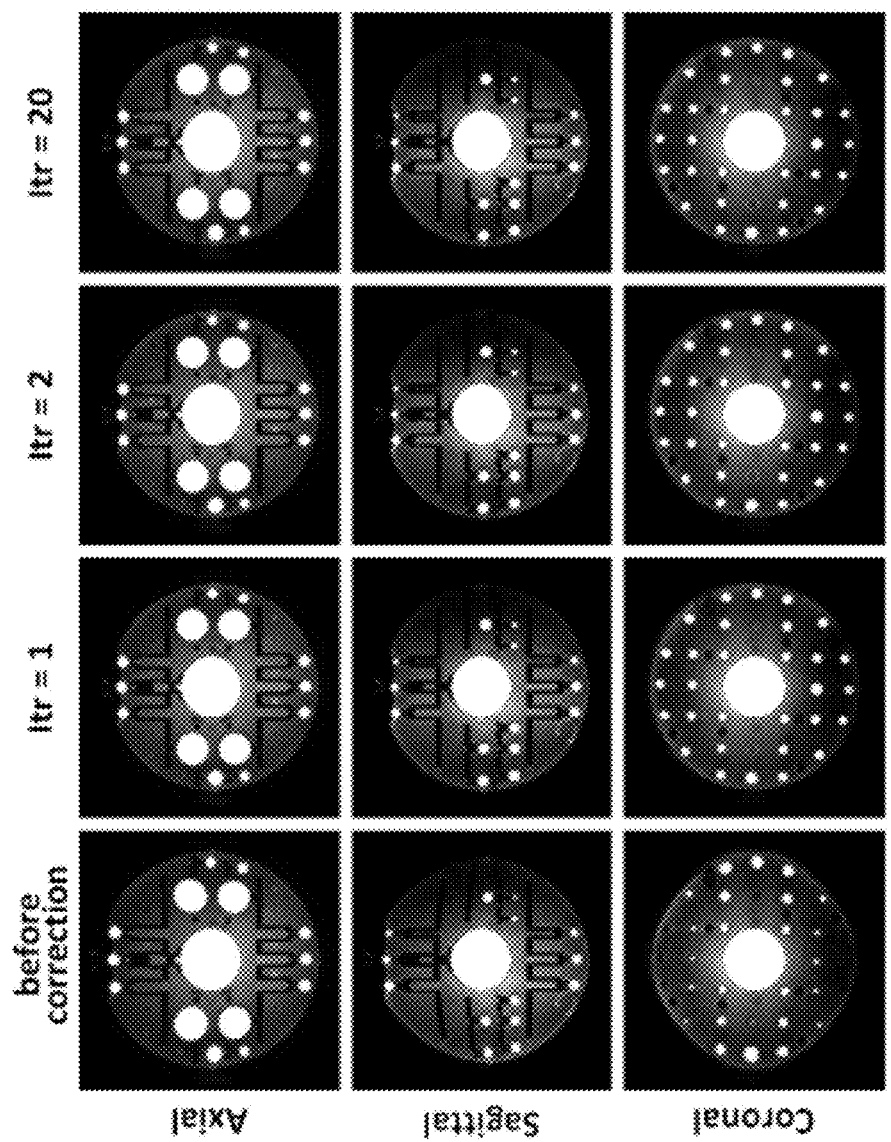
FIG. 2 depicts full scale images of an ADNI phantom before gradient nonlinearity correction, and post-correction using coefficient matrices generated (at different iterations) by the proposed iterative scheme.

As demonstrated in FIG. 2, the proposed calibration strategy effectively estimates gradient distortions present in this data—with no outside information—and enables it to be successfully corrected for in the images.

Example #5

Integrated Image Reconstruction and Gradient Nonlinearity Correction with Constrained Spatial Support In some embodiments, the methods described in the present disclosure implement a model-based MRI reconstruction with integrated gradient nonlinearity correction that prospectively accounts for gradient nonlinearity effects during reconstruction, while also including an image support constraint.

Accounting for gradient nonlinearities, the magnetic resonance signal measurement vector, g, from a Cartesian acquisition assuming full k-space sampling can be modeled as, $$g = Af + n \quad (40);$$

where f denotes the image vector, n denotes measured noise, and A denotes the spatial-encoding operator including gradient nonlinearity effects with, $$A(\kappa, i) = e^{-2\pi k(\kappa)\Delta(x[i])} \quad (41);$$

where $\Delta(x)$ represents the gradient nonlinearity-induced distortion field. For Cartesian acquisitions, A can be efficiently approximated using the type-I non-uniform-fast-Fourier transform ("NUFFT"); however, other spatial-encoding operators can also be used.

The interpolation operator used within NUFFT, and other spatial-encoding operators, assumes circulant boundary conditions. The gradient nonlinearity-induced distortion field does not necessarily possess such symmetry. As a result of this discrepancy, numerical errors are introduced in regions with strong distortions, where image content on the opposite side of the image matrix can be wrapped back to interfere with other image content.

To mitigate this effect, an image support constraint denoted by a binary diagonal matrix, M, is introduced to mask out the regions where the gradient nonlinearity distortion field violates the boundary conditions of the NUFFT, or other spatial-encoding operator. With this constraint, it is assumed that the image object does not occupy the region outside M, which is typically true for fully-sampled acquisitions. The spatial support, M, can be obtained based on the distortion field and the size of the interpolation kernel used in NUFFT, or other suitable spatial-encoding operators. Incorporating the spatial support, M, into the signal model leads to the following:

$$g = AMf + n = [A_M \quad A_0]\begin{bmatrix} f_M \\ 0 \end{bmatrix} + n = A_M f_M + n; \quad (42)$$

where $f_M$ represents the image vector within the spatial support constrained region M, and $A_M$ and $A_0$ correspond to columns in A encoding regions inside and outside M. The image reconstruction can be formatted into a linear optimization, $$\underset{f_M}{\mathrm{argmin}} \|g - A_M f_M\|_2^2. \quad (43)$$

In an example study, the brain of a healthy volunteer was scanned with a compact 3T scanner with asymmetric transverse gradients using an MPRAGE pulse sequence. NUFFT operators were implemented with a 5-point Kaiser-Bessel window and an (1.25x) oversampled FFT operator. The optimization problem in Eqn. (43) was solved using diagonally pre-conditioned conjugate-gradient iteration with the Jacobian-determinant as a preconditioner.

The methods for iterative reconstruction with integrated gradient nonlinearity correction and image support constraint described in the present disclosure can alleviate the noise amplification effect observed in some implementations of standard gradient nonlinearity correction, while better preserving image details. The methods described in the present disclosure are particularly advantageous for MRI systems that implement compact asymmetric gradients with a smaller imaging volume; however, similar noise reduction effects can also be provided on more conventional whole-body MRI systems. As one particular example, the methods described in the present disclosure can advantageously reducing noise effects in applications requiring large FOV (e.g., 45-50 cm), such as MR-based radiation therapy planning.

Figure 3:
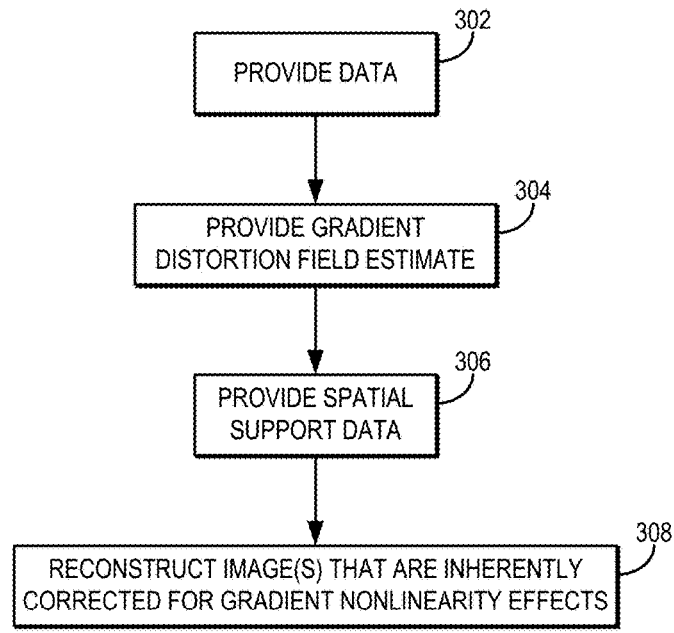
FIG. 3 is a flowchart setting forth steps for an example method for reconstructing magnetic resonance images using an integrated gradient nonlinearity and image reconstruction technique with a spatial support constraint.

Referring now to FIG. 3, a flowchart is illustrated as setting forth the steps of an example of a method for reconstructing an image from magnetic resonance data using an integrated image reconstruction and gradient nonlinearity correction technique, in which a spatial support constraint is also provided, such as those described above in detail.

The method begins by providing data for reconstruction, as indicated at step 302. In some aspects, the data may be provided by acquiring the data using an MRI system using any suitable acquisition method. In some other aspects, the MRI data can be previously acquired data that is provided by retrieving the data from a memory or other data storage. As described above, the methods of described in the present disclosure can be readily adapted for both Cartesian and non-Cartesian acquisitions (including echo planar imaging ("EPI")), whether or not undersampling is also implemented.

As part of the integrated reconstruction and gradient nonlinearity correction process, an estimate of the gradient distortion field for the MRI system is provided, as indicated at step 304. The gradient distortion field estimate can be provided by retrieving the appropriate information from the MRI system data storage, by performing an appropriate electromagnetic simulation, or by using a calibration procedure based on phantom images acquired with the MRI system.

As described above, in some embodiments the gradient distortion field can be provided from storage on an MRI scanner, or otherwise simulated using electromagnetic simulations. In other embodiments, however, the integrated image reconstruction and gradient nonlinearity correction can include an independent calibration process for estimating gradient distortions in individual scanners. As one example, MRI quality assurance phantoms with a priori known geometries are used to estimate the distortion field. Residual distortions present in images corrected using the estimated distortion field information are then iteratively minimized. This process requires no vendor-specific or proprietary information, and can thus be broadly implemented. In addition, because a gradient distortion field estimated from an imaged phantom is scanner-specific, not just model-specific, such estimations will generally be more accurate than universal models.

In one example, described below in more detail, this calibration procedure can be implemented using a quality assurance phantom, such as an Alzheimer's Disease Neuroimaging Initiative ("ADNI") phantom, and corresponding analysis software, such as AQUAL software; however, the described methodology can be readily adapted for other analogous phantoms and their associated, or otherwise appropriate, analysis software.

The method also includes providing spatial support data, as indicated at step 306. For instance, providing the spatial support data can include providing such data to a computer system. The spatial support data can be provided by retrieving previously generated spatial support data, or by computing or otherwise generating such data. For instance, the spatial support data can be computed from the gradient distortion field.

As one example, the spatial support data can include an image mask. The image mask may include an image matrix that provides weighting to pixel locations. For instance, the image mask can provide binary weighting to pixel locations, such that pixel locations residing within a spatial support region are weighted with values of one and pixel locations residing outside of the spatial support region are weighted with values of zero. In other implementations, the binary weighting can be such that pixel locations within the spatial support are weighted with values of zero, and pixel locations outside the spatial support are weighted with values of one. In still other implementations, weightings other than binary weightings can be used, as desired.

An image is reconstructed using an iterative reconstruction algorithm implemented with a hardware processor and a memory of the computer system, as indicated at step 308. The iterative reconstruction algorithm includes optimizing an objective function that is constrained by the spatial support data. For instance, images are reconstructed using a model-based estimation process that provides correction for gradient nonlinearities during, rather than after, image reconstruction while constraining the spatial support using the spatial support data. In general, this process is based on optimizing an objective function that incorporates the gradient distortion field to account for the gradient nonlinearity effects and a suitable spatial support constraint, such as the objective function in Eqn. (43).

Figure 4:
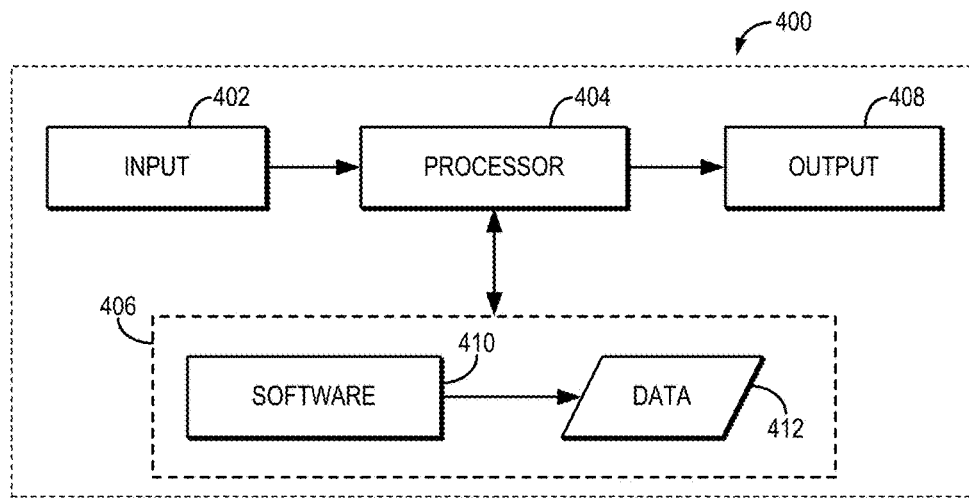
FIG. 4 is a block diagram of an example computer system that can implement the methods described in the present disclosure.

Referring now to FIG. 4, a block diagram of an example of a computer system 400 that can perform the methods described in the present disclosure is shown. The computer system 400 generally includes an input 402, at least one hardware processor 404, a memory 406, and an output 408. Thus, the computer system 400 is generally implemented with a hardware processor 404 and a memory 406.

In some embodiments, the computer system 400 can be a workstation, a notebook computer, a tablet device, a mobile device, a multimedia device, a network server, a mainframe, one or more controllers, one or more microcontrollers, or any other general-purpose or application-specific computing device.

The computer system 400 may operate autonomously or semi-autonomously, or may read executable software instructions from the memory 406 or a computer-readable medium (e.g., a hard drive, a CD-ROM, flash memory), or may receive instructions via the input 402 from a user, or any another source logically connected to a computer or device, such as another networked computer or server. Thus, in some embodiments, the computer system 400 can also include any suitable device for reading computer-readable storage media.

In general, the computer system 400 is programmed or otherwise configured to implement the methods and algorithms described in the present disclosure. For instance, the computer system 400 can be programmed to implement image reconstruction algorithms such as those described in the present disclosure.

The input 402 may take any suitable shape or form, as desired, for operation of the computer system 400, including the ability for selecting, entering, or otherwise specifying parameters consistent with performing tasks, processing data, or operating the computer system 400. In some aspects, the input 402 may be configured to receive data, such as data acquired with a magnetic resonance imaging ("MRI") system. Such data may be processed as described above to reconstruct images with reduced errors associated with gradient nonlinearity effects, as well as reduced noise amplification. In addition, the input 402 may also be configured to receive any other data or information considered useful for reconstructing images using the methods described above.

Among the processing tasks for operating the computer system 400, the one or more hardware processors 404 may also be configured to carry out any number of post-processing steps on data received by way of the input 402.

The memory 406 may contain software 410 and data 412, such as data acquired with an MRI system, and may be configured for storage and retrieval of processed information, instructions, and data to be processed by the one or more hardware processors 404. In some aspects, the software 410 may contain instructions directed to implementing image reconstruction algorithms, such as those described in the present disclosure.

In addition, the output 408 may take any shape or form, as desired, and may be configured for displaying reconstructed images, in addition to other desired information.

Figure 5:
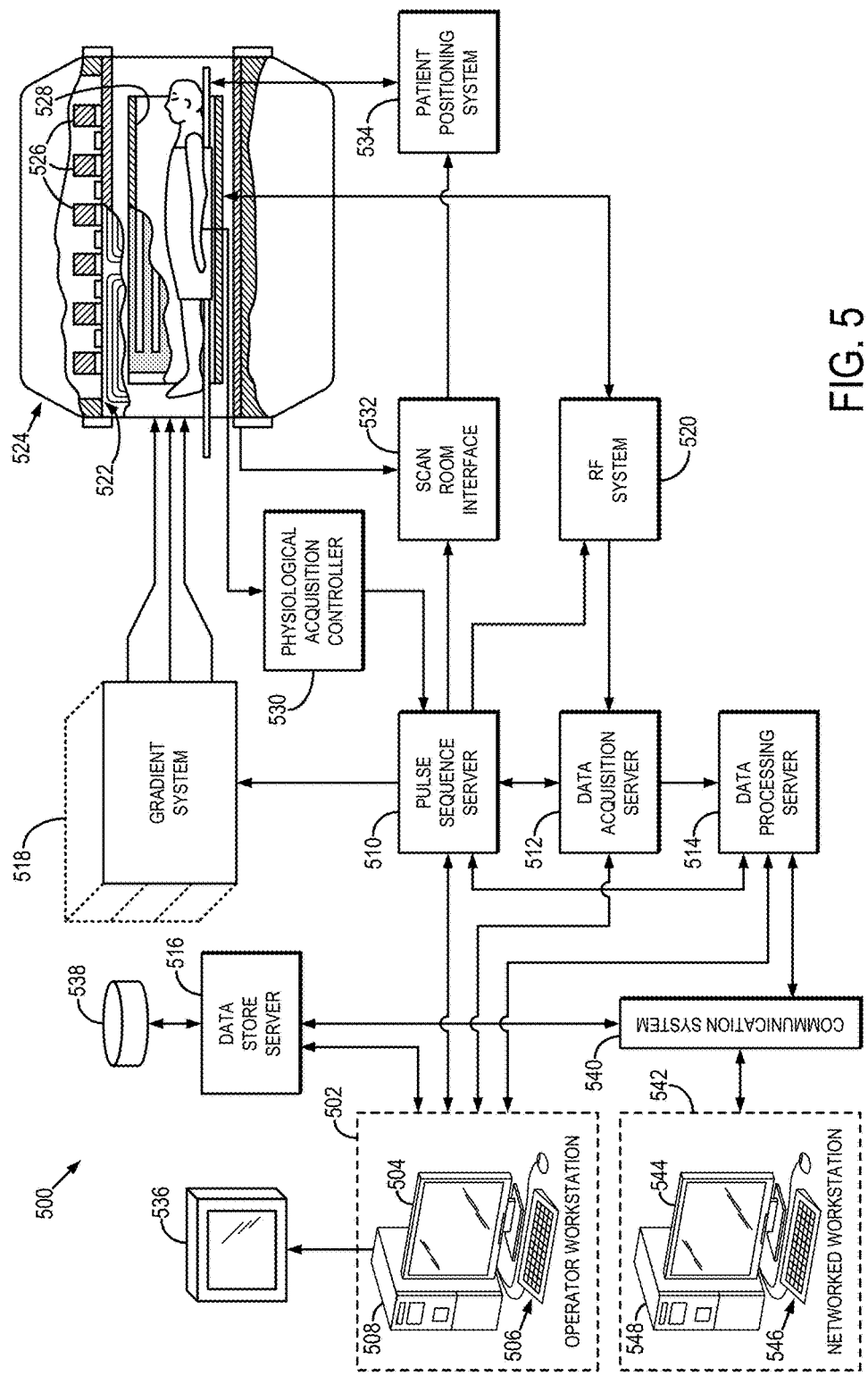
FIG. 5 is a block diagram of an example of a magnetic resonance imaging ("MRI") system.

Referring particularly now to FIG. 5, an example of an MRI system 500 that can implement the methods described here is illustrated. The MRI system 500 includes an operator workstation 502 that may include a display 504, one or more input devices 506 (e.g., a keyboard, a mouse), and a processor 508. The processor 508 may include a commercially available programmable machine running a commercially available operating system. The operator workstation 502 provides an operator interface that facilitates entering scan parameters into the MRI system 500. The operator workstation 502 may be coupled to different servers, including, for example, a pulse sequence server 510, a data acquisition server 512, a data processing server 514, and a data store server 516. The operator workstation 502 and the servers 510, 512, 514, and 516 may be connected via a communication system 540, which may include wired or wireless network connections.

The pulse sequence server 510 functions in response to instructions provided by the operator workstation 502 to operate a gradient system 518 and a radiofrequency ("RF") system 520. Gradient waveforms for performing a prescribed scan are produced and applied to the gradient system 518, which then excites gradient coils in an assembly 522 to produce the magnetic field gradients $G_x$, $G_y$, and $G_z$ that are used for spatially encoding magnetic resonance signals. The gradient coil assembly 522 forms part of a magnet assembly 524 that includes a polarizing magnet 526 and a whole-body RF coil 528.

RF waveforms are applied by the RF system 520 to the RF coil 528, or a separate local coil to perform the prescribed magnetic resonance pulse sequence. Responsive magnetic resonance signals detected by the RF coil 528, or a separate local coil, are received by the RF system 520. The responsive magnetic resonance signals may be amplified, demodulated, filtered, and digitized under direction of commands produced by the pulse sequence server 510. The RF system 520 includes an RF transmitter for producing a wide variety of RF pulses used in MRI pulse sequences. The RF transmitter is responsive to the prescribed scan and direction from the pulse sequence server 510 to produce RF pulses of the desired frequency, phase, and pulse amplitude waveform. The generated RF pulses may be applied to the whole-body RF coil 528 or to one or more local coils or coil arrays.

The RF system 520 also includes one or more RF receiver channels. An RF receiver channel includes an RF preamplifier that amplifies the magnetic resonance signal received by the coil 528 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \qquad (44);$$

and the phase of the received magnetic resonance signal may also be determined according to the following relationship:

$$\varphi = \tan^{-1}\left(\frac{Q}{I}\right). \qquad (45)$$

The pulse sequence server 510 may receive patient data from a physiological acquisition controller 530. By way of example, the physiological acquisition controller 530 may receive signals from a number of different sensors connected to the patient, including electrocardiograph ("ECG") signals from electrodes, or respiratory signals from a respiratory bellows or other respiratory monitoring devices. These signals may be used by the pulse sequence server 510 to synchronize, or "gate," the performance of the scan with the subject's heart beat or respiration.

The pulse sequence server 510 may also connect to a scan room interface circuit 532 that receives signals from various sensors associated with the condition of the patient and the magnet system. Through the scan room interface circuit 532, a patient positioning system 534 can receive commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, so that data is not lost by data overrun. In some scans, the data acquisition server 512 passes the acquired magnetic resonance data to the data processor server 514. In scans that require information derived from acquired magnetic resonance data to control the further performance of the scan, the data acquisition server 512 may be programmed to produce such information and convey it to the pulse sequence server 510. For example, during pre-scans, magnetic resonance data may be acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also process magnetic resonance signals used to detect the arrival of a contrast agent in a magnetic resonance angiography ("MRA") scan. For example, the data acquisition server 512 may acquire magnetic resonance data and processes it in real-time to produce information that is used to control the scan.

The data processing server 514 receives magnetic resonance data from the data acquisition server 512 and processes the magnetic resonance data in accordance with instructions provided by the operator workstation 502. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 514 are conveyed back to the operator workstation 502 for storage. Real-time images may be stored in a data base memory cache, from which they may be output to operator display 502 or a display 536. Batch mode images or selected real time images may be stored in a host database on disc storage 538. When such images have been reconstructed and transferred to storage, the data processing server 514 may notify the data store server 516 on the operator workstation 502. The operator workstation 502 may be used by an operator to archive the images, produce films, or send the images via a network to other facilities.

The MRI system 500 may also include one or more networked workstations 542. For example, a networked workstation 542 may include a display 544, one or more input devices 546 (e.g., a keyboard, a mouse), and a processor 548. The networked workstation 542 may be located within the same facility as the operator workstation 502, or in a different facility, such as a different healthcare institution or clinic.

The networked workstation 542 may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for reconstructing an image of a subject while correcting for gradient nonlinearity effects using a magnetic resonance imaging ("MRI") system, the steps of the method comprising:
   (a) providing to a computer system, magnetic resonance data acquired from a subject using an MRI system;
   (b) providing to the computer system, gradient distortion field data that indicates a spatial distribution of gradient distortions in a field-of-view;
   (c) providing to the computer system, spatial support data that indicates a spatial support by which image reconstruction should be constrained;
   (d) reconstructing an image of the subject from the magnetic resonance data while correcting for errors associated with a gradient nonlinearity by optimizing with the computer system an objective function that incorporates the gradient field distortion data and the spatial support data, thereby simultaneously reconstructing the image of the subject and correcting the image for the errors associated with the gradient nonlinearity.

2. The method as recited in claim 1, wherein the spatial support data comprises an image mask.

3. The method as recited in claim 2, wherein the image mask is generated from the gradient distortion field data.

4. The method as recited in claim 3, wherein the image mask weights pixel locations within a spatial support region by a first value and weights pixel locations outside the spatial support region by a second value.

5. The method as recited in claim 4, wherein the first value is one and the second value is zero.

6. The method as recited in claim 4, wherein the spatial support region contains pixel locations corresponding to values in the gradient distortion field data that are below a threshold level.

7. The method as recited in claim 6, wherein the second value is zero such that pixel locations corresponding to values in the gradient distortion field data above the threshold level are treated as having no image content.

8. The method as recited in claim 1, wherein the gradient distortion field data are estimated from a phantom having known geometrical information.

9. The method as recited in claim 8, wherein the phantom is a quality assurance phantom having markers located at known positions.

10. The method as recited in claim 9, wherein the gradient distortion field is estimated based on a displacement of the markers from the known positions.

11. The method as recited in claim 1, wherein the magnetic resonance data are acquired using Cartesian sampling.

12. The method as recited in claim 11, wherein step (d) implements a type-I non-uniform fast Fourier transform that accounts for the gradient nonlinearity.

13. The method as recited in claim 1, wherein the magnetic resonance data are acquired using a partial Fourier homodyne acquisition.

14. The method as recited in claim 1, wherein the magnetic resonance data are undersampled magnetic resonance data acquired using a multi-channel receive coil array.

15. The method as recited in claim 1, wherein the magnetic resonance data are acquired using non-Cartesian sampling.

16. The method as recited in claim 15, wherein step (d) implements a type-III non-uniform fast Fourier transform that accounts for the gradient nonlinearity.

* * * * *

UNITED STATES PATENT AND TRADEMARK OFFICE
CERTIFICATE OF CORRECTION

PATENT NO. : 10,267,886 B2
APPLICATION NO. : 15/953657
DATED : April 23, 2019
INVENTOR(S) : Matthew A. Bernstein, Joshua D. Trzasko and Shengzhen Tao Page 1 of 1

It is certified that error appears in the above-identified patent and that said Letters Patent is hereby corrected as shown below:

In the Specification

Column 11, Line 25 Eq (31), "(31)" should be -- (33) --.

Signed and Sealed this
Twenty-sixth Day of November, 2019

Andrei Iancu
*Director of the United States Patent and Trademark Office*